United States Patent
Mirgorodski et al.

(10) Patent No.: US 6,903,979 B1
(45) Date of Patent: Jun. 7, 2005

(54) EFFICIENT METHOD OF PMOS STACKED-GATE MEMORY CELL PROGRAMMING UTILIZING FEEDBACK CONTROL OF SUBSTRATE CURRENT

(75) Inventors: Yuri Mirgorodski, Sunnyvale, CA (US); Vladislav Vashchenko, Palo Alto, CA (US); Peter J. Hopper, San Jose, CA (US); Douglas J. Brisbin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 93 days.

(21) Appl. No.: 10/664,758

(22) Filed: Sep. 17, 2003

(51) Int. Cl.[7] ............................................... G11C 16/00
(52) U.S. Cl. ............................ 365/185.28; 365/185.18
(58) Field of Search ....................... 365/185.28, 185.22, 365/185.18

(56) References Cited

U.S. PATENT DOCUMENTS

| 4,698,787 | A | | 10/1987 | Mukherjee et al. | .......... 365/185 |
| 5,487,033 | A | * | 1/1996 | Keeney et al. | ......... 365/185.19 |
| 5,566,111 | A | * | 10/1996 | Choi | ..................... 365/185.22 |

* cited by examiner

*Primary Examiner*—Tan T. Nguyen
(74) *Attorney, Agent, or Firm*—Stallman & Pollock LLP

(57) ABSTRACT

A method of programming a PMOS stacked gate memory cell is provided that utilizes the correlation between injection current and substrate current during the programming cycle to provide a feedback correction to the control gate of the memory cell to compensate for the negative potential shift on the floating gate as a result of its charging time.

7 Claims, 2 Drawing Sheets

EFFICIENT METHOD OF PMOS STACKED-GATE MEMORY CELL PROGRAMMING UTILIZING FEEDBACK CONTROL OF SUBSTRATE CURRENT

TECHNICAL FIELD

The present invention provides a method of programming a PMOS stacked-gate memory cell by hot electron injection that utilizes feedback with substrate current. The method allows for an increase of programming effect ($V_T$ shift) and/or a reduction of programming voltage and/or a reduction in drain current.

DESCRIPTION OF THE INVENTION

Hot electron injection is a well known and widely used method of programming nonvolatile memory (NVM) cells. It is a common programming mechanism for stacked-gate cells, split-gate cells and other currently available NVM cells.

Figure 1:
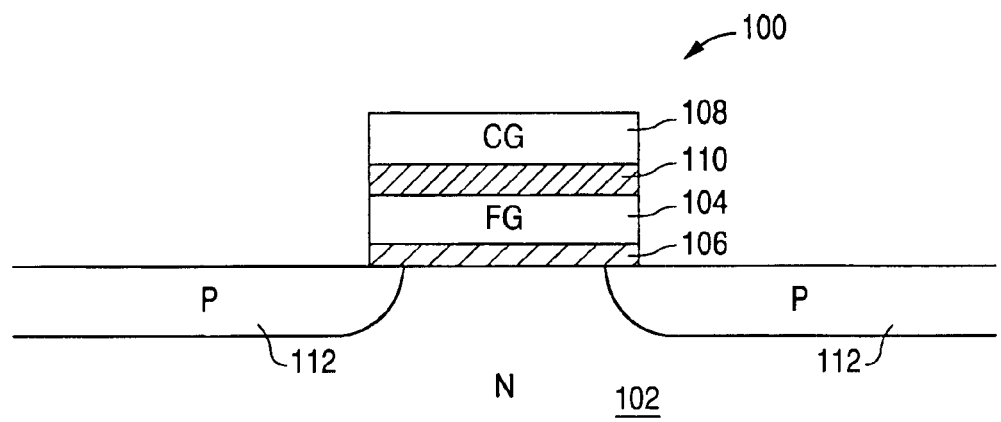
FIG. 1 is a partial cross-section drawing illustrating the general structure of a PMOS stacked gate memory cell.

FIG. 1 provides a general schematic representation of a conventional PMOS stacked gate NVM cell 100 formed in an N-type region 102 of semiconductor material, e.g. crystalline silicon. Those skilled in the art will appreciate that the N-type region 102 is typically an n-well formed in a P-type silicon substrate. The PMOS device 100 includes a conductive floating gate (FG) electrode 104, e.g. polysilicon, that is separated from the N-type region 102 by a layer of thin gate dielectric material 106, e.g. silicon dioxide. A control gate (CG) electrode 108, e.g. polysilicon, is separated from the floating gate 104 by a layer of interpoly dielectric material 110, e.g. an oxide-nitride-oxide sandwich. P-type diffusion regions 112 formed at the sides of the stacked gate structure provide the source/drain regions of the PMOS cell 100 and define an N-type channel region therebetween. The fabrication techniques for making the PMOS device 100 are well known.

When applied to a PMOS based stacked-gate cell 100, the hot electron injection programming method assumes that a high negative voltage is applied to the drain of the PMOS device. Depending on the erasing and coupling coefficient, a corresponding voltage is applied to the control gate 108 that brings the potential of the floating gate 104 to a value that is negative, but lower in absolute value compared with drain. In these conditions, the high lateral electric field creates hot electrons, and the high perpendicular electric field helps the hot electrons to reach the floating gate 104 through thin gate oxide 106. The injection current essentially depends on the potential of the drain and floating gate 104; that is, the more drain voltage, the more injection.

Figure 2:
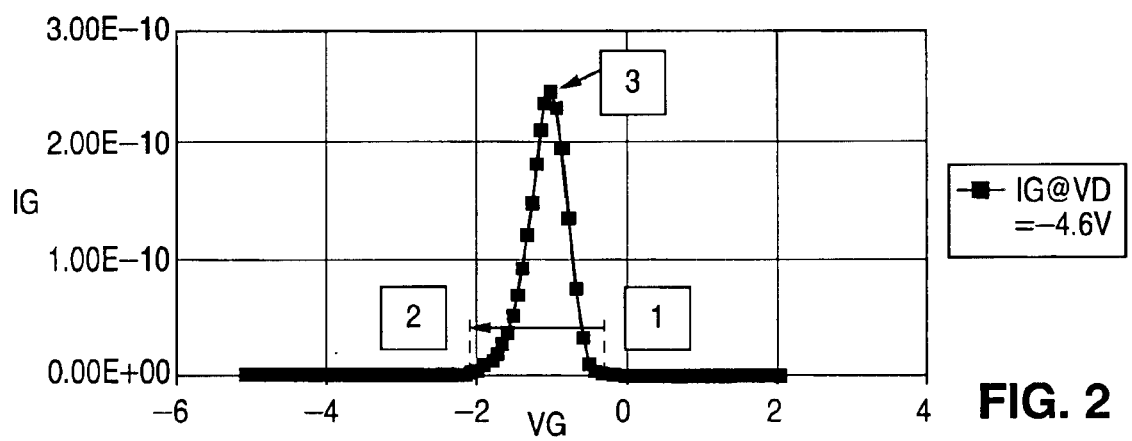
FIG. 2 is a graph showing floating gate current versus floating gate voltage.
Figure 3:
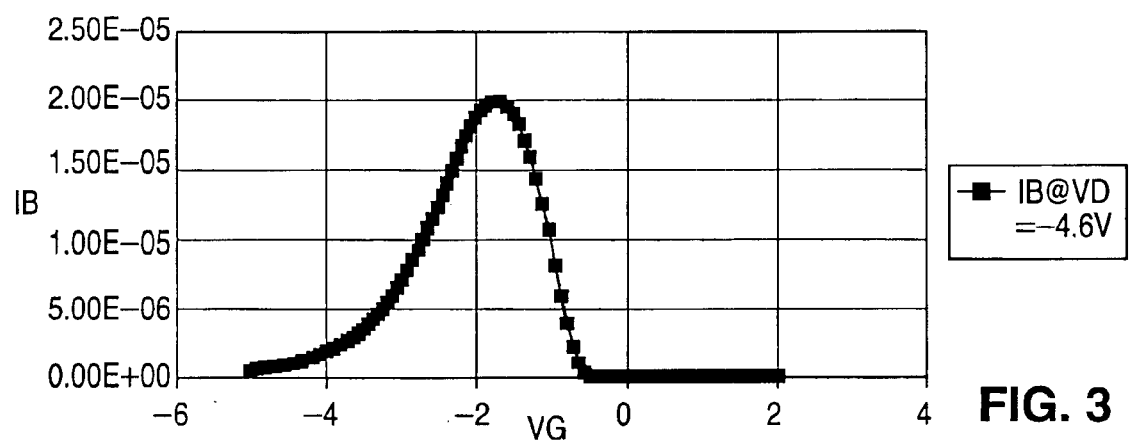
FIG. 3 is a graph showing substrate current versus floating gate voltage.

As shown in the FIG. 2 graph of PMOS floating gate current versus floating gate voltage, the gate current of the PMOS device 100 has a maximum with respect to the floating gate voltage. As shown in FIGS. 2 and 3, this maximum has the same origin and correlates well with substrate current.

With continuing reference to the FIG. 2 graph, conventional programming starts from a floating gate potential that is close to the right side of the pick (position 1 in FIG. 2). During programming, the floating gate 104 receives a negative charge of electron injection current. As a result, the floating gate potential moves to more negative values until it stops in a position 2 (FIG. 2) with very low injection current. This means the end of programming that results in a shift of $V_T$ that is equal to the voltage difference (Delta) between positions 1 and 2. This shift depends on the drain voltage via the pick's width; it does not depend on pick's height. The control gate voltage only gives a start to the programming operation, but does not affect $V_T$ shift.

Thus, the conventional hot electron injection programming method is not optimal during the whole programming cycle. Indeed, if a constant voltage is applied to the control gate, the gate current is a strong function of the floating gate potential, as shown in FIG. 2. Therefore, at the beginning of the programming cycle, the charging current is rather small; then, at some optimal potential (~1.2V in FIG. 2), the charging current is maximal. Then again, with the floating gate potential increase, the charging current becomes low again.

In accordance with the present invention, floating gate potential is always kept close to (surfing on) the maximum of injection current (position 3, FIG. 2). In order to realize this during programming, the control gate is provided with a feedback correction as an additional voltage increase in order to compensate for the negative potential shift on the floating gate that is produced as a result of its charging in time.

Because the floating gate is isolated, its voltage and current cannot be monitored directly. But, based on the fact of correlation between the injection current and the substrate current (FIG. 3), floating gate current is substituted with substrate current for the purpose of monitoring what the floating gate potential is. That is, in accordance with the invention, a feedback is implemented that increases control gate voltage to maintain substrate current at maximum.

The conventional programming method can make programming better ($V_T$ shift larger) only by increasing the drain voltage (and accompanying increase of drain current). In contrast, the method disclosed herein also allows using control gate voltage to improve programming; the same programming effect may be achieved even with lower drain voltage and current.

In general, the feedback circuit can be implemented both by taking the informative potential from the whole memory cell array or by using only a single control memory cell to develop the potential for the separate array.

Practically, since the drain voltage is fixed, the disclosed method can be converged to the problem of supporting maximum substrate current through the cell during programming by controlling the potential of the control gate.

Figure 4A:
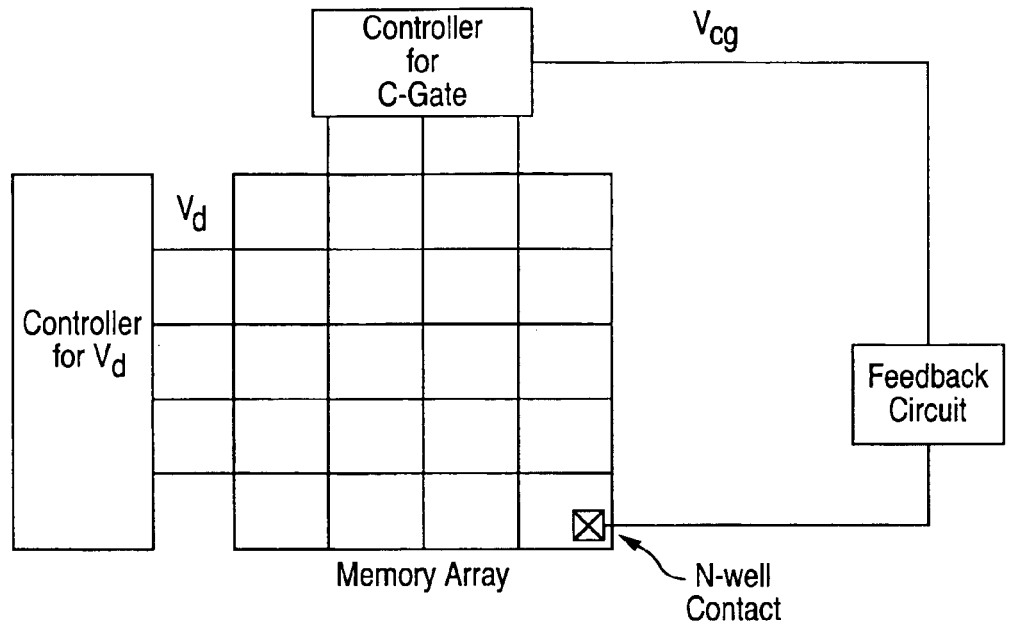
FIGS. 4A and 4B are block diagrams illustrating feedback realization using, respectively, the signal from an entire NVM array and from a small reference cell.
Figure 4B:
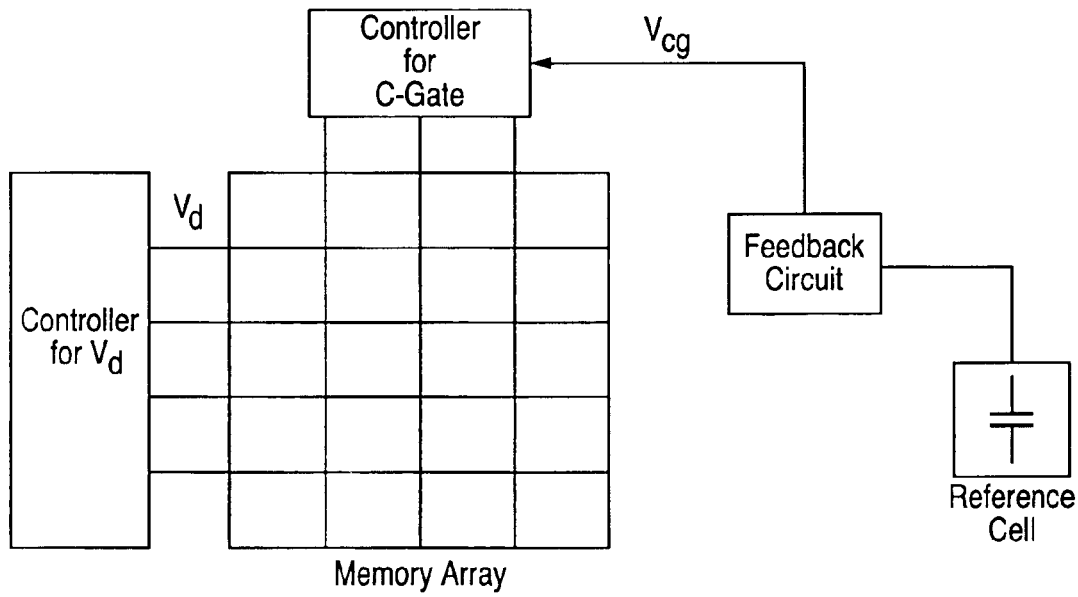

The block diagram of the feedback circuit is presented in FIGS. 4A and 4B. It contains sensor resistor in the substrate circuit and feedback circuit connected to the control gate bus.

Although only specific embodiments of the present invention are shown and described herein, the invention is not to be limited by these embodiments. Rather, the scope of the invention is to be defined by these descriptions taken together with the attached claims and their equivalents.

What is claimed is:

1. A method of programming a PMOS stacked-gate memory cell, wherein the memory cell includes a p-type source region in n-type semiconductor substrate, a p-type drain region formed in the n-type semiconductor substrate material and space-apart from the p-type source region to define a substrate channel region therebetween, a conductive floating gate electrode formed over the substrate channel region and separated therefrom by gate dielectric material, and a conductive control gate electrode formed over the floating gate electrode and separated therefrom by integrate dielectric material, the programming method comprising:

applying a negative voltage potential to the p-type drain region;

applying a voltage potential to the control gate electrode such that electrons are attached to the floating gate electrode from the p-type drain region through the gate dielectric material;

establishing a correlation between floating gate injection current and semiconductor substrate material current;

monitoring the value of the semiconductor substrate material current; and utilizing the monitored value of the semiconductor substrate material current to provide a feedback correction signal to the voltage potential applied to the control gate electrode such that the semiconductor substrate material current is maximized during programming of the memory cell.

2. A programming method as in claim 1, and wherein the stacked-gate memory cell is included in a memory cell array comprising a plurality of such stacked-gate memory cells formed in n-type semiconductor substrate material, and wherein the monitored value is obtained from the memory cell array.

3. A programming method as in claim 1, and wherein the stacked-gate memory cell is included in a memory cell array comprising a plurality of such stacked-gate memory cells formed in n-type semiconductor substrate material, and wherein the monitored value is obtained from a single stacked-gate memory cell.

4. The programming method of claim 1, and wherein the semiconductor material is n-type silicon.

5. The programming method of claim 4, and wherein the gate dielectric material is silicon dioxide.

6. The programming method of claim 5, and wherein the floating gate electrode is polysilicon.

7. The programming method of claim 6, and wherein the control gate electrode is polysilicon.

* * * * *